(12) United States Patent
Rasel et al.

(10) Patent No.: US 12,463,057 B2
(45) Date of Patent: Nov. 4, 2025

(54) METHOD FOR PRODUCING A BASE PLATE

(71) Applicant: Infineon Technologies AG, Neubiberg (DE)

(72) Inventors: Marco Rasel, Meschede (DE); Elvis Keli, Bad Sassendorf (DE)

(73) Assignee: Infineon Technologies AG, Neubiberg (DE)

( * ) Notice: Subject to any disclaimer, the term of this patent is extended or adjusted under 35 U.S.C. 154(b) by 514 days.

(21) Appl. No.: 17/362,076

(22) Filed: Jun. 29, 2021

(65) Prior Publication Data
US 2022/0005708 A1 Jan. 6, 2022

(30) Foreign Application Priority Data

Jul. 6, 2020 (EP) ................................. 20184207

(51) Int. Cl.
*H01L 21/48* (2006.01)
*H01L 23/13* (2006.01)
*H01L 23/367* (2006.01)
*H01L 23/498* (2006.01)

(52) U.S. Cl.
CPC ...... *H01L 21/4878* (2013.01); *H01L 21/4871* (2013.01); *H01L 23/13* (2013.01); *H01L 23/367* (2013.01); *H01L 23/49822* (2013.01); *Y10T 29/49002* (2015.01)

(58) Field of Classification Search
CPC .......... H01L 23/3735; H01L 2924/181; H01L 21/4871; H01L 21/4878; H01L 23/13; H01L 23/36; H01L 21/4882; H01L 23/3107; H01L 2224/1601; Y10T 29/49002; Y10T 29/49117; Y10T 29/49155; Y10T 428/24917

USPC ............. 29/592.1, 505, 523, 525, 825, 830
See application file for complete search history.

(56) References Cited

U.S. PATENT DOCUMENTS

| | | | | |
|---|---|---|---|---|
| 9,000,580 B2 * | 4/2015 | Groening | ................ | H01L 23/40 257/707 |
| 9,929,066 B1 * | 3/2018 | Spann | ..................... | H01L 23/04 |
| 2019/0333781 A1 | 10/2019 | Wehner et al. | | |

FOREIGN PATENT DOCUMENTS

| | | |
|---|---|---|
| CN | 105580131 A | 5/2016 |
| CN | 107112303 A | 8/2017 |
| CN | 107533984 A | 1/2018 |
| DE | 102012201172 A1 | 8/2013 |
| EP | 3352214 A1 | 7/2018 |
| JP | 2015076551 A | 4/2015 |
| WO | 0165601 A2 | 9/2001 |
| WO | 2015053316 A1 | 4/2015 |
| WO | 2019138744 A1 | 7/2019 |

* cited by examiner

*Primary Examiner* — Thiem D Phan
(74) *Attorney, Agent, or Firm* — Murphy, Bilak & Homiller, PLLC (57) ABSTRACT

A method comprises producing a base plate, wherein producing the base plate comprises forming a layer of a metallic material, and forming at least one first area in the layer of metallic material, wherein forming the at least one first area either comprises locally deforming the layer of metallic material, or locally inducing stress into the layer of metallic material, or both such that a deflection or a local stress or both in the at least one first area differs from a deflection or a local stress or both of those areas of the metallic layer surrounding the at least one first area.

11 Claims, 5 Drawing Sheets

METHOD FOR PRODUCING A BASE PLATE

TECHNICAL FIELD

The instant disclosure relates to a base plate for a semiconductor module arrangement and to a method for producing such a base plate.

BACKGROUND

Power semiconductor module arrangements often include a base plate within a housing. At least one substrate is arranged on the base plate. A semiconductor arrangement including a plurality of controllable semiconductor elements (e.g., two IGBTs in a half-bridge configuration) is arranged on each of the at least one substrate. Each substrate usually comprises a substrate layer (e.g., a ceramic layer), a first metallization layer deposited on a first side of the substrate layer and a second metallization layer deposited on a second side of the substrate layer. The controllable semiconductor elements are mounted, for example, on the first metallization layer. The second metallization layer is usually attached to the base plate by means of a solder layer or a sintering layer. When mounting the at least one substrate to the base plate, e.g., by soldering or sintering techniques, the substrates are under the influence of high temperatures, wherein the temperatures usually lie at about 250° C. or more, sometimes even at about 500° C. and more. The at least one substrate, the connection layer (e.g., solder layer), and the base plate usually have different CTEs (coefficients of thermal expansion). When heating, and subsequently cooling the different components during the assembly process, the difference between the CTEs of the different materials (e.g., copper, ceramic, solder) leads to a deformation of the base plate, usually a concave deflection in the direction of the surface on which the substrates are mounted.

When mounting the base plate to a heat sink, a connection layer (e.g., thermal interface material) is arranged between the base plate and the heat sink. Such a connection layer usually completely fills the space between the base plate and the heat sink and therefore has a non-uniform thickness because of the deflection of the base plate. The connection layer often has poor heat conducting properties as compared to the substrate and the base plate. Therefore, the thickness of the connection layer greatly influences the heat conduction as well as other parameters (the thicker the connection layer, the poorer the heat conduction). During the assembly of the semiconductor module arrangement, however, the base plate may locally expand or contract which may lead to local deflections in the areas below the substrates. This may result in unwanted cavities or voids between the base plate and the heat sink that are not filled with the material of the connection layer (e.g., thermal paste) at all. In other areas, the connection layer may be too thick to still provide sufficient heat conducting properties. This negatively influences the heat dissipation from the base plate to the heat sink.

There is a need for a base plate that avoids the drawbacks mentioned above as well as others and which allows to produce power semiconductor module arrangements with an increased performance and reliability, and for a method for producing such a base plate.

SUMMARY

A method includes producing a base plate, wherein producing the base plate comprises forming a layer of a metallic material, and forming at least one first area in the layer of metallic material, wherein forming the at least one first area either comprises locally deforming the layer of metallic material, or locally inducing stress into the layer of metallic material, or both such that a deflection or a local stress or both in the at least one first area differs from a deflection or a local stress or both of those areas of the metallic layer surrounding the at least one first area.

A base plate for a power semiconductor module includes a layer of a metallic material, and at least one first area formed in the layer of metallic material in which either the layer of metallic material is locally deformed, or a stress is locally increased in the layer of metallic material, or both such that a deflection or a local stress or both in the at least one first area differs from a deflection or a local stress or both of those areas of the metallic layer surrounding the at least one first area.

An arrangement includes a base plate, and at least one substrate mounted on the base plate, wherein each of the at least one substrate includes a dielectric insulation layer and a first metallization layer attached to the dielectric insulation layer, and the base includes a layer of a metallic material, and at least one first area formed in the layer of metallic material in which either the layer of metallic material is locally deformed, or a stress is locally increased in the layer of metallic material, or both such that a deflection or a local stress or both in the at least one first area differs from a deflection or a local stress or both of those areas of the metallic layer surrounding the at least one first area.

The invention may be better understood with reference to the following drawings and the description. The components in the figures are not necessarily to scale, emphasis instead being placed upon illustrating the principles of the invention. Moreover, in the figures, like referenced numerals designate corresponding parts throughout the different views.

BRIEF DESCRIPTION OF THE DRAWINGS

FIG. 2, including

FIG. 3, including FIGS. 3A and 3B, schematically illustrates a severely curved base plate (FIG. 3A), and a minimally curved base plate (FIG. 3B).

FIG. 4, including FIGS. 4A-4D, schematically illustrates cross-sectional views and a top view of a conventional base plate with a plurality of substrates mounted thereon, where FIGS. 4A-4C illustrate a base plate that is not mounted on a heat sink, and FIG. 4D illustrates a base plate that is mounted on a heat sink.

FIG. 5, including FIGS. 5A-5D, schematically illustrates cross-sectional views and a top view of a base plate with a plurality of substrates mounted thereon according to one example, where FIGS. 5A-5C illustrate a base plate that is not mounted on a heat sink, and FIG. 5D illustrates a base plate that is mounted on a heat sink.

FIG. 7, including FIGS. 7A and 7B, schematically illustrates top views of base plates according to different examples.

FIG. 10, including FIGS. 10A to 10C, schematically illustrates cross-sectional views of tools for processing a base plate according to different examples.

DETAILED DESCRIPTION

In the following detailed description, reference is made to the accompanying drawings. The drawings show specific examples in which the invention may be practiced. It is to be understood that the features and principles described with respect to the various examples may be combined with each other, unless specifically noted otherwise. In the description as well as in the claims, designations of certain elements as "first element", "second element", "third element" etc. are not to be understood as enumerative. Instead, such designations serve solely to address different "elements". That is, e.g., the existence of a "third element" does not necessarily require the existence of a "first element" and a "second element". An electrical line or electrical connection as described herein may be a single electrically conductive element, or include at least two individual electrically conductive elements connected in series and/or parallel. Electrical lines and electrical connections may include metal and/or semiconductor material, and may be permanently electrically conductive (i.e., non-switchable). A semiconductor body as described herein may be made from (doped) semiconductor material and may be a semiconductor chip or be included in a semiconductor chip. A semiconductor body has electrically connectable pads and includes at least one semiconductor element with electrodes.

Figure 1:
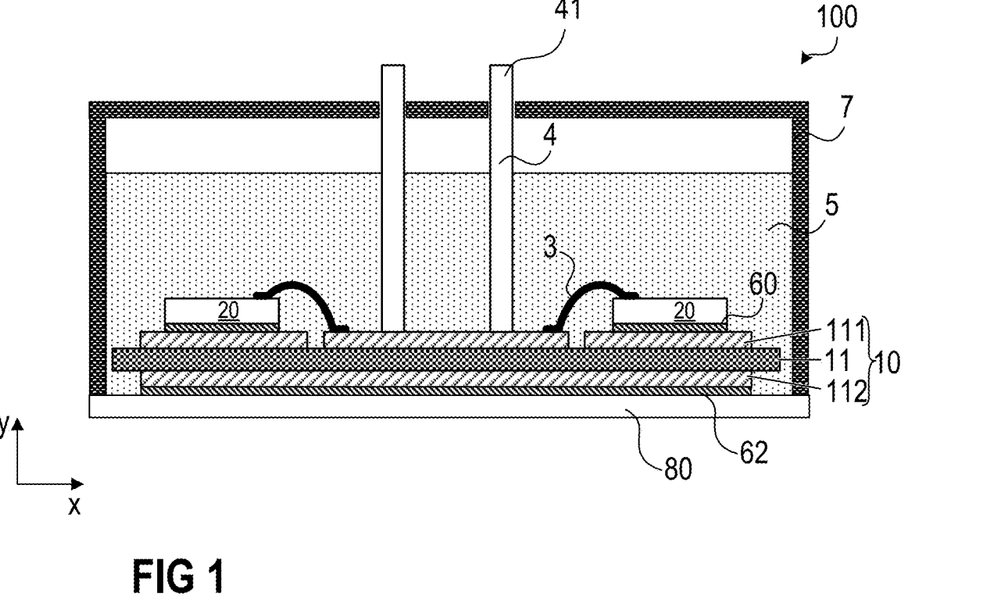
FIG. 1 is a cross-sectional view of a power semiconductor module arrangement.

Referring to FIG. 1, a cross-sectional view of a power semiconductor module arrangement 100 is illustrated. The power semiconductor module arrangement 100 includes a housing 7 and a substrate 10. The substrate 10 includes a dielectric insulation layer 11, a (structured) first metallization layer 111 attached to the dielectric insulation layer 11, and a (structured) second metallization layer 112 attached to the dielectric insulation layer 11. The dielectric insulation layer 11 is disposed between the first and second metallization layers 111, 112.

Each of the first and second metallization layers 111, 112 may consist of or include one of the following materials: copper; a copper alloy; aluminum; an aluminum alloy; any other metal or alloy that remains solid during the operation of the power semiconductor module arrangement. The substrate 10 may be a ceramic substrate, that is, a substrate in which the dielectric insulation layer 11 is a ceramic, e.g., a thin ceramic layer. The ceramic may consist of or include one of the following materials: aluminum oxide; aluminum nitride; zirconium oxide; silicon nitride; boron nitride; or any other dielectric ceramic. Alternatively, the dielectric insulation layer 11 may consist of an organic compound and include one or more of the following materials: $Al_2O_3$, AlN, SiC, BeO, BN, or $Si_3N_4$. For instance, the substrate 10 may, e.g., be a Direct Copper Bonding (DCB) substrate, a Direct Aluminum Bonding (DAB) substrate, or an Active Metal Brazing (AMB) substrate. Further, the substrate 10 may be an Insulated Metal Substrate (IMS). An Insulated Metal Substrate generally comprises a dielectric insulation layer 11 comprising (filled) materials such as epoxy resin or polyimide, for example. The material of the dielectric insulation layer 11 may be filled with ceramic particles, for example. Such particles may comprise, e.g., $Si_2O$, $Al_2O_3$, AlN, SiN or BN and may have a diameter of between about 1 μm and about 50 μm. The substrate 10 may also be a conventional printed circuit board (PCB) having a non-ceramic dielectric insulation layer 11. For instance, a non-ceramic dielectric insulation layer 11 may consist of or include a cured resin.

The substrate 10 is arranged in a housing 7. In the example illustrated in FIG. 1, the substrate 10 is arranged on a base plate 80 which forms a base surface of the housing 7, while the housing 7 itself solely comprises sidewalls and a cover. In some power semiconductor module arrangements 100, more than one substrate 10 is arranged on the same base plate 80 and within the same housing 7. The base plate 80 may comprise a layer of a metallic material such as, e.g., copper or AlSiC. Other materials, however, are also possible.

One or more semiconductor bodies 20 may be arranged on the at least one substrate 10. Each of the semiconductor bodies 20 arranged on the at least one substrate 10 may include a diode, an IGBT (Insulated-Gate Bipolar Transistor), a MOSFET (Metal-Oxide-Semiconductor Field-Effect Transistor), a JFET (Junction Field-Effect Transistor), a HEMT (High-Electron-Mobility Transistor), or any other suitable semiconductor element.

The one or more semiconductor bodies 20 may form a semiconductor arrangement on the substrate 10. In FIG. 1, only two semiconductor bodies 20 are exemplarily illustrated. The second metallization layer 112 of the substrate 10 in FIG. 1 is a continuous layer. According to another example, the second metallization layer 112 may be a structured layer. According to other examples, the second metallization layer 112 may be omitted altogether. The first metallization layer 111 is a structured layer in the example illustrated in FIG. 1. "Structured layer" in this context means that the respective metallization layer is not a continuous layer, but includes recesses between different sections of the layer. Such recesses are schematically illustrated in FIG. 1. The first metallization layer 111 in this example includes three different sections. Different semiconductor bodies 20 may be mounted to the same or to different sections of the first metallization layer 111. Different sections of the first metallization layer may have no electrical connection or may be electrically connected to one or more other sections using electrical connections 3 such as, e.g., bonding wires. Semiconductor bodies 20 may be electrically connected to each other or to the first metallization layer 111 using electrical connections 3, for example. Electrical connections 3, instead of bonding wires, may also include bonding ribbons, connection plates or conductor rails, for example, to name just a few examples. The one or more semiconductor bodies 20 may be electrically and mechanically connected to the substrate 10 by an electrically conductive connection layer 60. Such an electrically conductive connection layer 60 may be a solder layer, a layer of an electrically conductive adhesive, or a layer of a sintered metal powder, e.g., a sintered silver (Ag) powder, for example.

The power semiconductor module arrangement 100 illustrated in FIG. 1 further includes terminal elements 4. The terminal elements 4 are electrically connected to the first metallization layer 111 and provide an electrical connection between the inside and the outside of the housing 7. The terminal elements 4 may be electrically connected to the first metallization layer 111 with a first end, while a second end 41 of the terminal elements 4 protrudes out of the housing 7. The terminal elements 4 may be electrically contacted from the outside at their second end 41. Such terminal elements 4, however, are only an example. The components inside the housing 7 may be electrically contacted from outside the housing 7 in any other suitable way. For example, terminal elements 4 may be arranged closer to or adjacent to the sidewalls of the housing 7. It is also possible that terminal elements 4 protrude vertically or horizontally through the sidewalls of the housing 7. It is even possible that terminal elements 4 protrude through a ground surface of the housing 7. The first end of a terminal element 4 may be electrically and mechanically connected to the substrate 10 by an electrically conductive connection layer, for example (not explicitly illustrated in FIG. 1). Such an electrically conductive connection layer may be a solder layer, a layer of an electrically conductive adhesive, or a layer of a sintered metal powder, e.g., a sintered silver (Ag) powder, for example. The first end of a terminal element 4 may also be electrically coupled to the substrate 10 via one or more electrical connections 3, for example.

The power semiconductor module arrangement 100 may further include an encapsulant 5. The encapsulant 5 may consist of or include a silicone gel or may be a rigid molding compound, for example. The encapsulant 5 may at least partly fill the interior of the housing 7, thereby covering the components and electrical connections that are arranged on the substrate 10. The terminal elements 4 may be partly embedded in the encapsulant 5. At least their second ends 41, however, are not covered by the encapsulant 5 and protrude from the encapsulant 5 through the housing 7 to the outside of the housing 7. The encapsulant 5 is configured to protect the components and electrical connections of the power semiconductor module 100, in particular the components arranged inside the housing 7, from certain environmental conditions and mechanical damage. It is generally also possible to omit the housing 7 and solely protect the substrate 10 and any components mounted thereon with an encapsulant 5. In this case, the encapsulant 5 may be a rigid material, for example.

At least some semiconductor bodies 20 of the power semiconductor module arrangement 100 generally perform a plurality of switching operations during the operation of the power semiconductor module arrangement 100. When performing many switching operations within a short period of time, for example, the semiconductor bodies 20 generate heat which, in the worst case, may rise to a temperature above a certain maximum threshold. Temperatures above such a maximum threshold may adversely affect the operation of the power semiconductor module, or even lead to the total failure of one or more semiconductor dies 20. Heat generated during the operation of the power semiconductor module arrangement 100 is usually dissipated from the substrate 10 through the base plate 80 to a heat sink (not specifically illustrated in FIG. 1). This will be explained in further detail with respect to FIGS. 4 and 5 below.

Figure 2A:
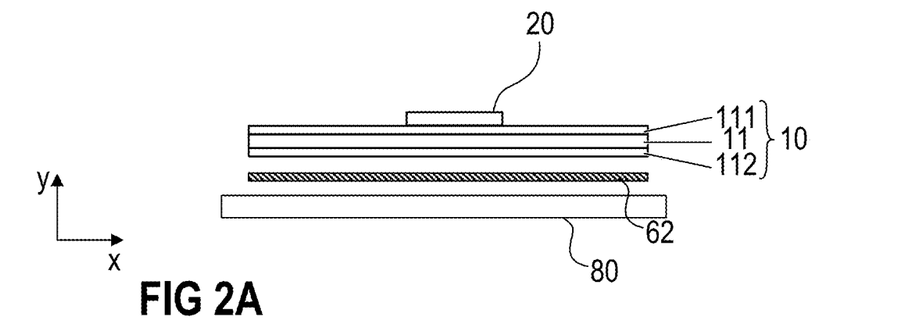
FIGS. 2A-2C, illustrates cross-sectional views of a semiconductor substrate for different steps during the process of mounting the substrate on a base plate.
Figure 2B:
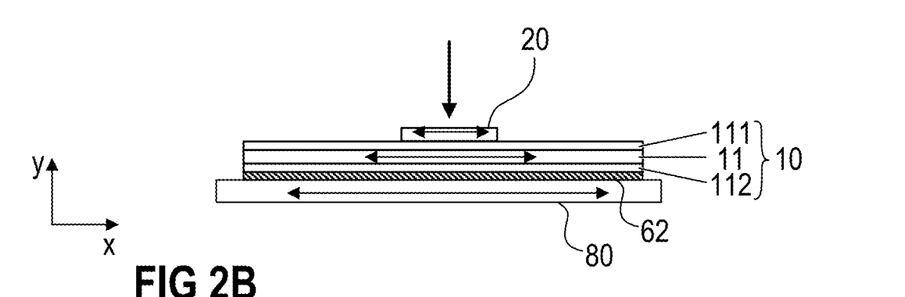
Figure 2C:
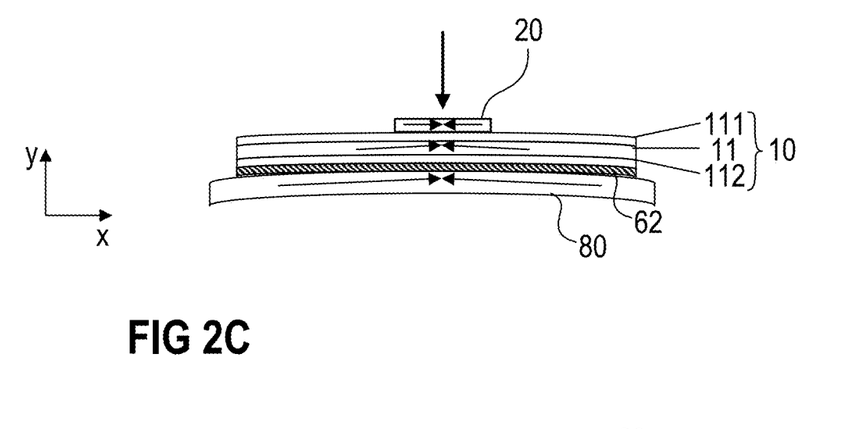

Now referring to FIG. 2, a process of mounting a substrate 10 on a base plate 80 is schematically illustrated. The substrate 10 may be mechanically connected to the base plate 80 by a heat-conducting connection layer 62. That is, referring to FIG. 2A, a heat-conducting connection layer 62 may be arranged between the substrate 10 and the base plate 80. The heat-conducting connection layer 62 that is applied between the substrate 10 and the base plate 80 may be a metallic solder layer or a sintered layer, for example. These, however, are only examples. The heat-conducting connection layer 62 may comprise any other suitable heat conducting material that is suitable to form a mechanical connection between the substrate 10 and the base plate 80. When the substrate 10 is mounted on the base plate 80 (at least one semiconductor body 20 may already be mounted on the substrate 10 at this stage), the substrate 10 is pressed onto the base plate 80 under the influence of high temperatures. This is schematically illustrated in FIG. 2B. During this process, the substrate 10 and the base plate 80 may be distorted. This is, because the semiconductor body 20, the substrate 10, the connection layer 62 and the base plate 80 each comprise different materials. The different materials have different CTEs (coefficients of thermal expansion). Therefore, under the influence of high temperatures each of the components expands to a different extent, which is indicated with the different arrows in FIG. 2B. The components are subsequently cooled down again, which results in a contraction of the different materials (indicated with the different arrows in FIG. 2C). The extent of the contraction also depends on the CTE of the materials. Therefore, after mounting a substrate 10 on the base plate 80, the base plate 80 often has a concave deflection in the direction of the surface on which the substrate 10 is mounted. This is schematically illustrated in FIG. 2C. The base plate 80 may be deflected in one direction in space only. However, as is schematically illustrated in FIG. 3, the base plate 80 may also be deflected in two directions in space, resulting in a cushion-shape or shell-like shape of the base plate 80. The deflection of the base plate 80 or, in other words, the deviation from its original (essentially plane/flat) form, may be, e.g., between about 20 μm and about 2000 μm or even more (the deviation corresponds to the difference in height between the edges and the center of the base plate 80). In order to compensate the resulting deflection, base plates 80 are often pre-bent (before mounting the substrate 10 on the base plate 80) in a direction opposite to the direction of the resulting deflection.

In a power semiconductor module, one or more substrates 10 are usually arranged on a single base plate 80. The base plate 80 may have a thickness of between about 1 mm and about 6 mm, for example. The base plate 80, however, may also be thinner than 1 mm or thicker than 6 mm. The base plate 80 may comprise a layer consisting of or including a metal or a metal matrix composite material (e.g., metal matrix composite MMC such as aluminum silicon carbide), for example. Suitable materials for a metal base plate 80 are, for example, copper, a copper alloy, aluminum, or an aluminum alloy. The base plate 80 may be coated by a thin coating layer (not illustrated). Such a coating layer may consist of or include nickel, silver, gold, or palladium, for example. The coating layer is optional and may improve the solderability of the base plate 80.

Figure 4A:
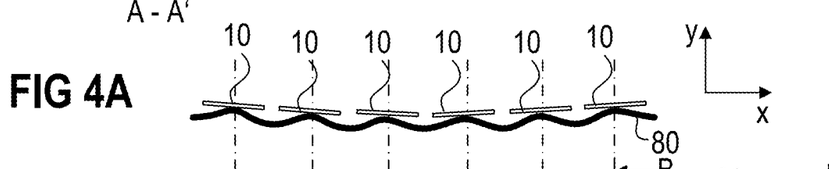

A plurality of substrates 10 that is mounted on a base plate 80 is exemplarily illustrated in FIG. 4A. In particular, FIG. 4A schematically illustrates the base plate 80 after soldering the substrates 10 to the base plate 80 (corresponds to the state of the substrate 10 and base plate 80 as illustrated in FIG. 2C). During operation of the semiconductor module arrangement, heat is generated by the semiconductor bodies 20 (semiconductor bodies 20 not specifically illustrated in FIG. 4) which is transferred to the substrates 10 and further to the base plate 80. The temperatures are usually considerably higher in areas of the base plate 80 arranged directly below the substrates 10 than in areas of the base plate 80 arranged in between the substrates 10. The base plate 80, therefore, is heated unevenly. When heating the base plate 80 during operation of the semiconductor arrangement, it may deform even further. Due to the uneven heating of the base plate 80 in addition to the different CTEs of the different components (CTE mismatch), some areas of the base plate 80 deform more than others. This is exemplarily illustrated in FIG. 4A. The base plate 80 illustrated in FIG. 4A, in addition to the overall concave deflection, shows a plurality of local deflections below the different substrates 10. These local deflections may be convex deflections in the direction of the surface on which the substrates 10 are mounted.

Figure 4B:
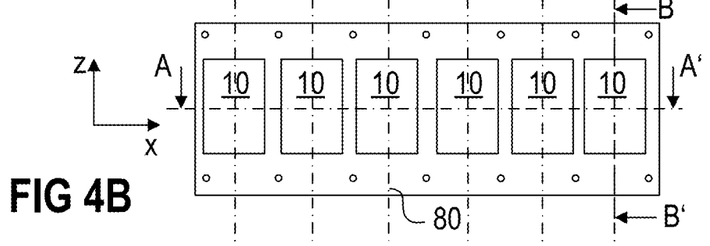
Figure 4C:
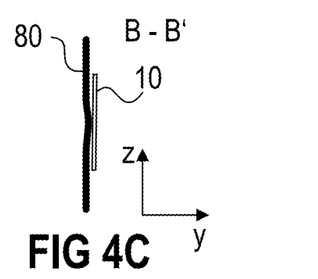
Figure 4D:
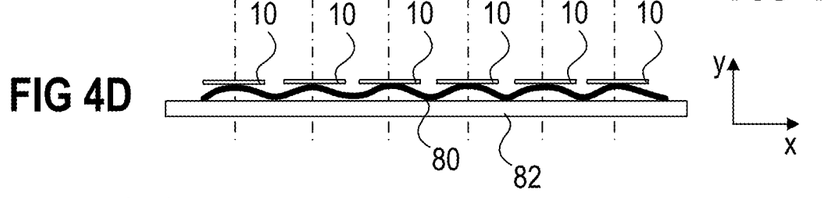

FIG. 4B schematically illustrates a top view of the base plate 80 and substrates 10 of FIG. 4A, while FIG. 4C schematically illustrates a cross-sectional view of the base plate 80 in a different horizontal direction (section plane B-B') than FIG. 4A (section plane A-A'). FIG. 4D schematically illustrates the base plate 80 of FIG. 4A which is mounted on a heat sink 82. As can be seen, due to the local deflections the base plate 80 may be in direct contact with the heat sink 82 only in some areas. In other areas, unwanted cavities or voids may form between the base plate 80 and the heat sink 82. As the cavities or voids are mainly formed directly below the substrates 10 where most of the heat is generated, the heat dissipation from the base plate 80 to the heat sink 82 is greatly deteriorated.

Figure 6:
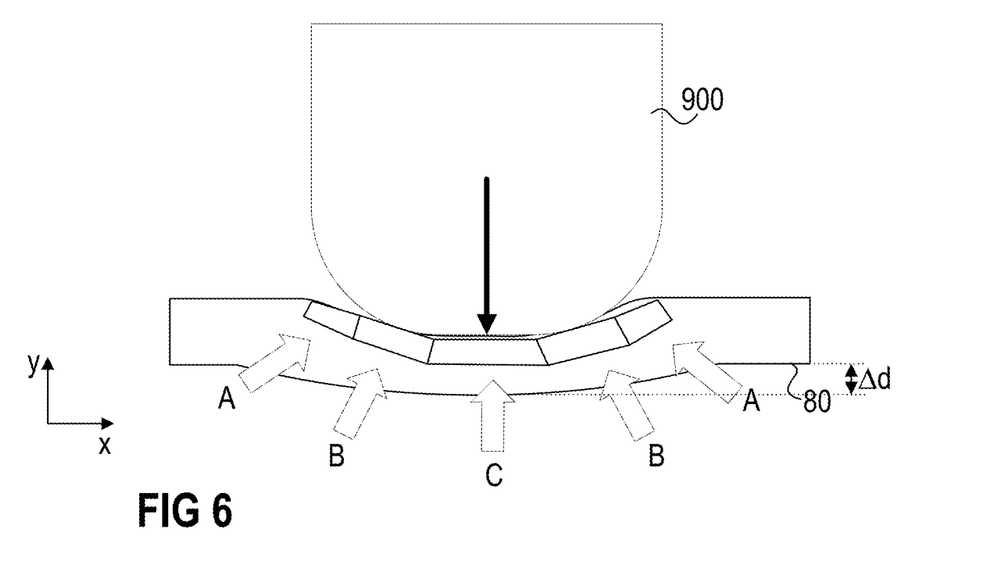
FIG. 6 schematically illustrates a cross-sectional view of a base plate and a tool for processing a base plate.

In order to reduce or even prevent such local cavities or voids from forming when mounting the substrates 10 on the base plate 80 or, possibly, also during the operation of the power semiconductor module arrangement, a base plate 80 according to one example comprises at least one area of increased local stress. This is exemplarily illustrated in the cross-sectional view of FIG. 6. FIG. 6 schematically illustrates a cross-sectional view of a base plate 80. A first tool 900 is used to create an area of increased stress in the base plate 80. In particular, the first tool 900 exerts pressure onto the base plate 80 in a desired area. In this way, the material of the base plate 80 is locally compressed and the stiffness of the base plate 80, therefore, is locally increased. At the same time, the base plate 80 may be locally deformed. In particular, a local concave deformation is formed in the base plate 80 in the direction of the surface on which the substrate 10 is mounted (substrate not specifically illustrated in FIG. 6).

In this way, a yield strength of the base plate 80 may be locally increased. The yield strength of the base plate 80 in its normal state may generally be between 100 and 300 MPa, for example. This yield strength may be locally increased by between 5% and 100% of the yield strength of the base plate 80 in the normal state, for example. Usually, within the area of increased yield strength, the yield strength is increased differently for different sections A, B, C. For example, in a first section A near the edge of the area of increased yield strength, the yield strength may be between 270 and 320 MPa, for example. In a second section B arranged adjacent to the first section A, the yield strength may be between 320 and 380 MPa, for example. In a third section C arranged at the center of the area of increased yield strength, the yield strength may be between 380 and 500 MPa, for example. This is, because the first tool 900 may not be able to create the same yield strength within the whole area of increased yield strength. In the Figures, three different sections A, B, C are exemplarily illustrated. This, however, is only an example. The number of sections A, B, C, for example, may depend on the kind and form of the first tool 900 that is used to form the area of increased yield strength, on the size of the area of increased yield strength, on the maximum value of increased yield strength, or on any other parameters relevant for the formation of the area of increased yield strength. The transitions between the different sections may be fluent and not strictly defined.

Figures 7A, 7B:
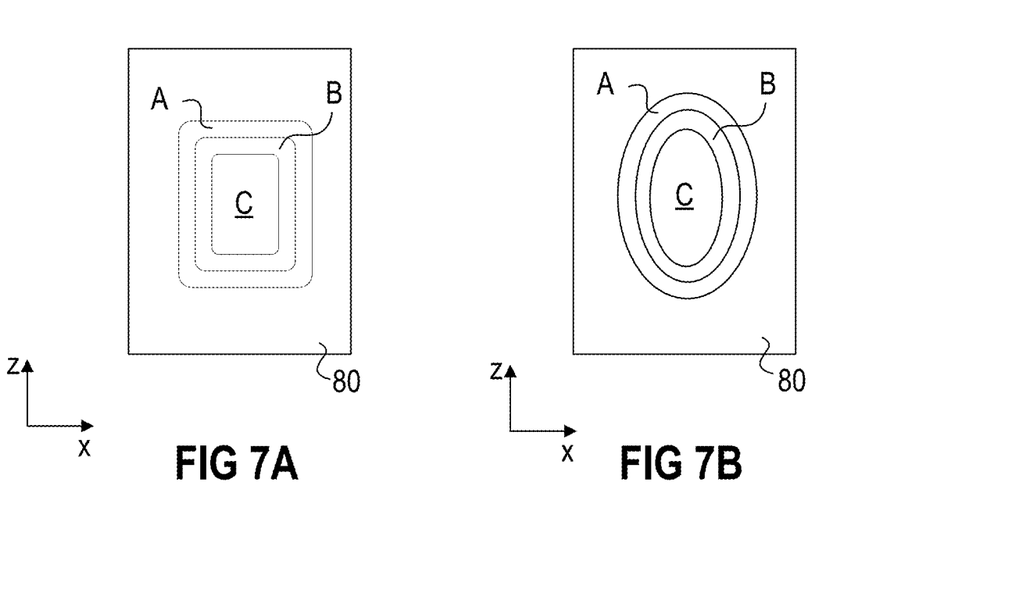

The area of increased stress with the different sections A, B, C of increased stress is also schematically illustrated in the top views of FIGS. 7A and 7B. The first tool 900, and therefore the resulting area of increased stress may have an angular (e.g., square or rectangular, FIG. 7A), oval (FIG. 7B) or rounded (not specifically illustrated) cross-section, for example. Other shapes, however, are also possible.

Figure 8:
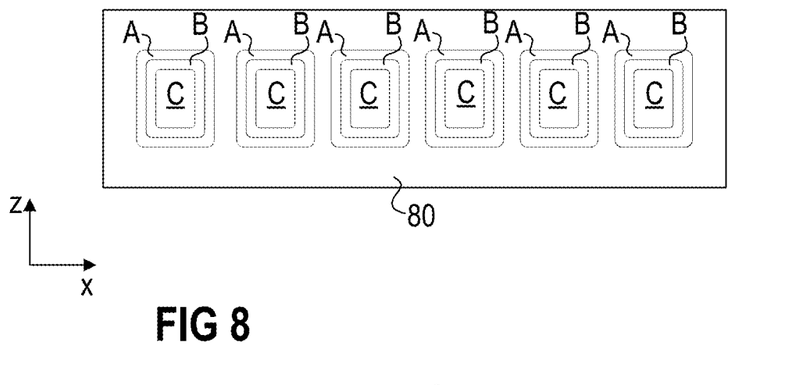
FIG. 8 schematically illustrates a top view of a base plate according to one example.

The number of areas of increased stress or yield strength on a base plate 80 may depend on the number of substrates 10 mounted to the base plate 80. If only one substrate 10 is to be mounted to the base plate 80, one area of increased stress or yield strength may be formed in the base plate 80. If more than one substrate 10 is to be mounted to a single base plate 80, the number of areas of increased stress or yield strength may correspond to the number of substrates 10 that are to be mounted to the base plate 80. A base plate 80 with a plurality of areas of increased stress or yield strength is schematically illustrated in the top view of FIG. 8. In this example, six areas of increased stress or yield strength are formed in the base plate 80.

Figure 3A:
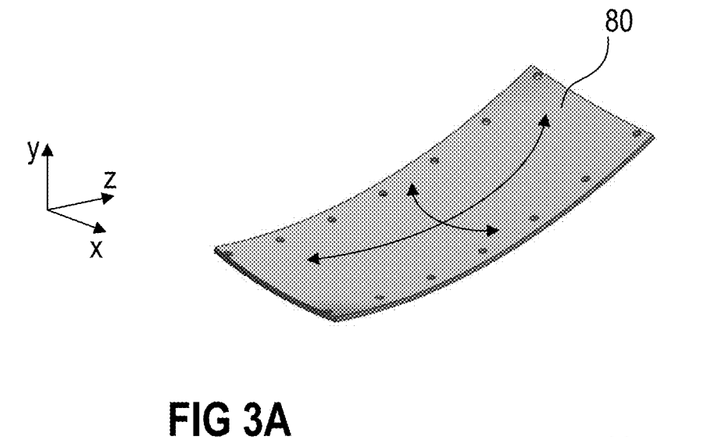
Figure 3B:
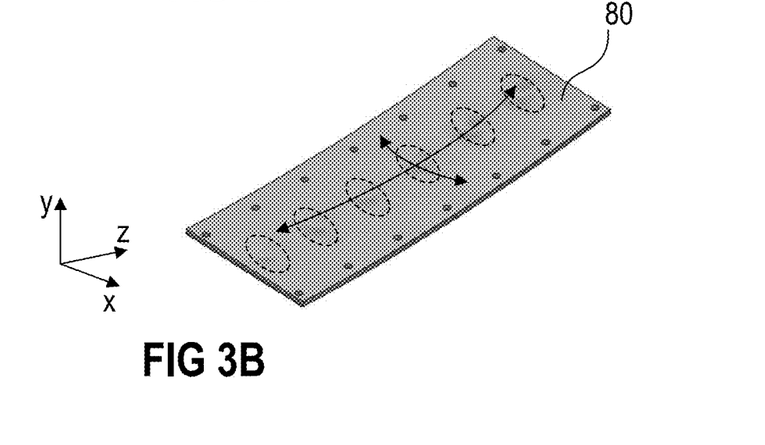
Figure 5A:
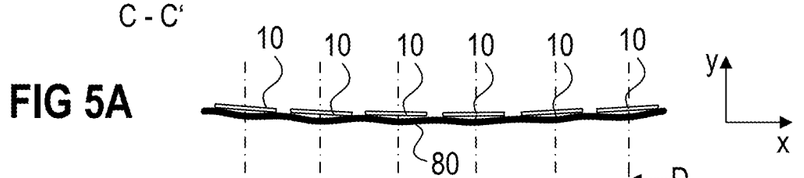
Figure 5B:
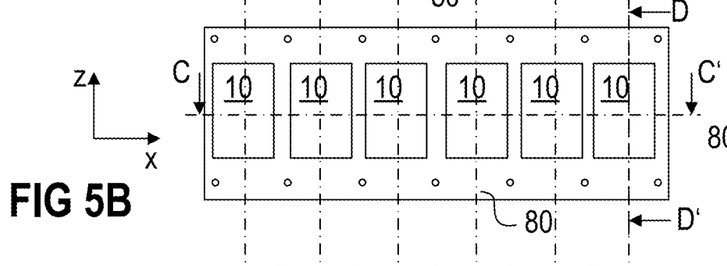

When forming an area of increased stress in the base plate 80, the Young's modulus (also referred to as e-module) may also be increased in this area. The Young's modulus is a mechanical property that measures the stiffness of a solid material. That is, by increasing the Young's modulus, the stiffness of the base plate 80 is locally increased. By increasing the yield strength and the stiffness, the deformation of the base plate 80 when mounting the substrates 10 on the base plate 80 is significantly reduced. This is schematically illustrated in FIG. 5. Firstly, an overall deflection (as exemplarily illustrated in FIG. 3) may be reduced significantly. In this context, FIG. 3A schematically illustrates a base plate 80 that has a comparably severe or heavy bow, and FIG. 3B schematically illustrates a base plate 80 having a reduced bow as compared to the base plate 80 of FIG. 3A. The base plate 80 illustrated in FIG. 3A is a base plate 80 without an area of increased stress, while the base plate 80 illustrated in FIG. 3B comprises a plurality of areas of increased stress (illustrated in dashed lines in FIG. 3B). Further, and as is schematically illustrated in FIG. 5A (cross-sectional view in a section plane C-C', see FIG. 5B), the formation of local deformations of the base plate 80 below the substrates 10 during the process of mounting the substrates 10 to the base plate 80 is greatly reduced as compared to the conventional arrangement as illustrated in FIG. 4. Even further, while in the conventional arrangement the local deflections may be convex deflections in the direction of the surface on which the substrates 10 are mounted (base plate 80 is hollow below substrates 10), the local deflections in the example illustrated in FIG. 5A are concave deflections in the direction of the surface on which the substrates 10 are mounted (base plate 80 is crowned below substrates 10). This results from the local deformations introduced in the base plate 80 during the formation of the areas of increased stress (see, e.g., FIG. 6). Even further, the direction of the deflection may be reversed as compared to the arrangement of FIG. 4. In this way, the contact between those areas of the base plate 80 arranged below the substrates 10 and the heat sink 82 is significantly increased. In particular, the contact between those areas of the base plate 80 arranged below the central regions of the substrates 10 where the semiconductor bodies 20 are usually mounted and the heat sink 82 is significantly increased.

Figure 5C:
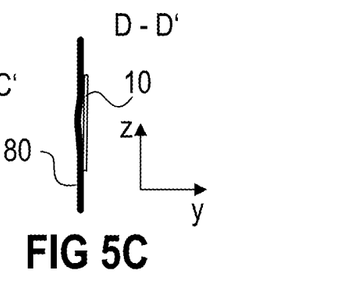
Figure 5D:
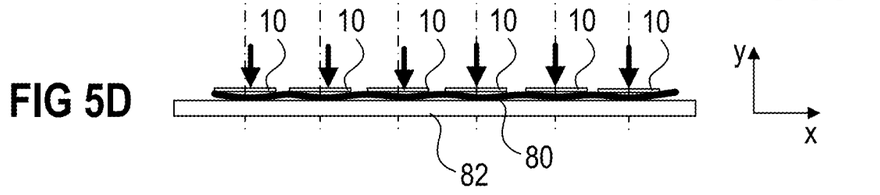

The local deflections below the substrates 10 are generally small enough in order not to result in large cavities. That is, the comparably small cavities that are formed between the base plate 80 and the heat sink 82 may be completely filled with heat conducting material which significantly increases the heat dissipation from the base plate 80 to the heat sink 82. Even further, as the local deflections of the base plate 80 are significantly reduced, the contact area between the base plate 80 and the heat sink 82 increases. A direct contact between the base plate 80 and the heat sink 82 may be primarily provided in such areas that are arranged centrally below the substrates 10. This helps to further increase the overall heat dissipation, as the central areas of the substrates 10 are usually the areas where most heat is generated. Therefore, the heat conduction between the substrates 10 and the base plate 80 as well as between the base plate 80 and the heat sink 82 is satisfactory. FIG. 5C, similar to FIG. 4C, schematically illustrates a cross-section of the base plate 80 of FIG. 5B in a section plane D-D', while FIG. 5A illustrates the base plate 80 in a section plane C-C'. FIG. 5D illustrates the base plate 80 of FIG. 5A that is mounted on a heat sink 82.

In addition to reducing the local deflections (local bow) below the substrates 10, the overall concave deflection of the base plate 80 may also be reduced. The areas of increased stress are generally formed before mounting the substrates 10 to the base plate 80. For example, the areas of increased stress may be formed during or immediately after production of the base plate 80. When mounting the substrates 10 to the base plate 80 after forming such areas of increased stress, the base plate 80 deforms to a significantly lower degree while mounting the substrates 10 to the base plate 80. This also adds to an increase of the thermal coupling between the base plate 80 and the heat sink 82.

The cross-sectional area of an area of increased stress is generally smaller than the cross-sectional area of the base plate 80. That is, there are areas of the base plate 80 surrounding the areas of increased stress in which the properties of the base plate 80 are substantially unaltered. A stress induced in the areas of increased stress is higher than a basic stress in the surrounding areas of the base plate 80. A yield strength in the areas of increased stress is higher than a yield strength in those areas of the base plate 80 surrounding the areas of increased stress. Further, no or no significant deflection is induced in those areas of the base plate 80 surrounding the areas of increased stress.

The cross-sectional area of an area of increased stress may be smaller than the cross-sectional area of the substrate 10 that is mounted on the respective section of increased stress. That is, an area of increased stress may be completely covered by a substrate 10 mounted thereon. It is, however, also possible that the cross-sectional area of an area of increased stress is larger than the cross-sectional area of the substrate 10 that is mounted thereon. According to one example, the cross-sectional area of an area of increased stress may be up to 50% smaller or larger than the cross-sectional area of the substrate 10 that is mounted on the respective section of increased stress. Other sizes of the areas of increased stress, however, are also possible. If more than one area of increased stress is formed in a single base plate 80, such areas of increased stress may be formed at a certain distance from each other. That is, one area of increased stress may not directly contact any of the other areas of increased stress. It is, however, also possible that different areas of increased stress directly adjoin each other.

Figure 10A:
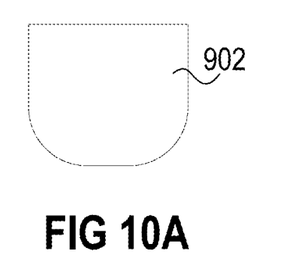
Figure 10B:
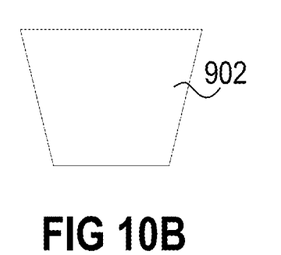
Figure 10C:
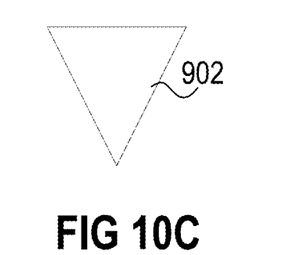

The dimension of the local deflection below a substrate 10 may depend on the kind of first tool 900 that is used to form the deflection. A depth Δd of a local deflection (deviation from its original flat position, see FIG. 6) may be between 5 to 200 μm, for example. The size (cross-sectional area) of the local deflection or area of increased stress may depend on the size and shape of the first tool 900 used to form the deflection. Different exemplary geometries of a first tool 900 are exemplarily illustrated in FIGS. 10A, 10B and 10C. The first tool 900 illustrated in FIG. 10A generally has a flat underside with rounded edges towards its sides. The first tool 900 illustrated in FIG. 10B generally has a flat underside with comparably sharp edges towards its sides. The first tool 900 illustrated in FIG. 10C has a generally triangular shape. Other geometries of the first tool 900, however, are generally also possible, resulting in different sizes and shapes of the areas of increased stress.

Figure 9:
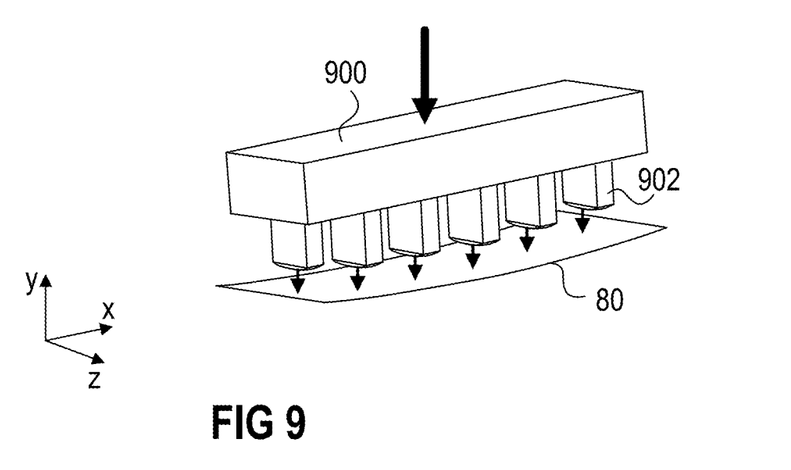
FIG. 9 schematically illustrates a three dimensional view of a base plate and a tool for processing a base plate.

Now referring to FIG. 9, a first tool 900 is schematically illustrated that is configured to simultaneously form a plurality of areas of increased stress in a base plate 80. The first tool 900 comprises a main body and a plurality of stamping tools 902 extending from the main body. The first tool 900 may be pressed onto a base plate 80 such that the plurality of stamping tools 902 contact the base plate 80. Each stamping tool 902 may have a geometry similar to the geometries that have been explained with respect to FIGS. 10A-10C.

The first tool 900 as described herein, however, is only an example. Generally it is possible to form an area of increased stress in any other suitable way. For example, laser welding techniques, piezo-peening techniques, coining techniques, bending techniques, or cold forging techniques may also be used to form areas of increased stress in the base plate 80, to name just a few examples.

In the examples described above, an area of increased stress and, at the same time, a local deflection are formed in the base plate 80. This, however, is only an example. Generally, it is also possible to only form a local deflection as described above in the base plate 80, without locally increasing the stress though. Solely forming a local deflection below each of the at least one substrate 10 may be enough to reduce the negative effects as described with respect to FIG. 4 above. The locally formed concave deflections may counteract the formation of the local convex deflection as described with respect to FIG. 4A above, even without additionally forming areas of increased stress, yield strength and stiffness below each of the at least one substrate 10. Therefore, forming concave deflections below the substrates 10 may be sufficient for some applications.

On the other hand, it is also possible to form areas of increased stress below the substrates 10, without locally deforming the base plate 80. This may also be sufficient for some applications. For other applications it may be beneficial to both form local deflections as well as areas of increased stress below the substrates 10 as described above. Forming both local deflections as well as areas of increased stress below the substrates 10 may be beneficial, for example, if the base plate 80 and substrates 10 are comparably large.

A method according to one example, therefore, may comprise producing a base plate 80, wherein producing the base plate 80 comprises forming a layer of a metallic material, and forming at least one first area in the layer of metallic material, wherein forming the at least one first area either comprises locally deforming the layer of metallic material, or locally inducing stress into the layer of metallic material, or both such that a deflection or a local stress or both in the at least one first area differs from a deflection or a local stress or both of those areas of the metallic layer surrounding the at least one first area.

The invention claimed is:
1. A method comprising:
   producing a base plate, wherein producing the base plate comprises
   forming a layer of a metallic material;
   forming at least one first area in the layer of metallic material, wherein forming the at least one first area either comprises locally deforming the layer of metallic material, or locally inducing stress into the layer of metallic material, or both such that a deflection or a local stress or both in the at least one first area differs from a deflection or a local stress or both of those areas of the metallic layer surrounding the at least one first area; and wherein forming the at least one first area in the layer of metallic material comprises locally compressing the layer of metallic material to form at least one local concave deflection.

2. The method of claim 1, further comprising:

arranging at least one substrate on a first surface of the base plate, wherein arranging at least one substrate on the base plate comprises arranging one substrate adjacent to each of the at least one first area, and wherein each of the at least one substrate comprises a dielectric insulation layer and a first metallization layer attached to the dielectric insulation layer.

3. The method of claim 2, wherein, after arranging the at least one substrate on the base plate, each of the at least one substrate completely covers one of the at least one first area.

4. The method of claim 1, wherein forming the at least one first area comprises a stamping process, a laser welding process, a piezo-peening process, a coining process, a bending process, or a cold forging process.

5. The method of claim 1, wherein forming at least one first area in the layer of metallic material comprises locally compressing the material of the layer of metallic material.

6. The method of claim 1, wherein locally increasing the stress in the metallic layer comprises increasing a yield strength in the at least one first area as compared to surrounding areas of the metallic layer.

7. The method of claim 6, wherein a yield strength of the areas surrounding the at least one first area is between 100 MPa and 300 MPa and a yield strength of the at least one first area is increased by between 5% and 100% of the yield strength of the areas surrounding the at least one first area.

8. The method of claim 1, wherein locally deforming the layer of metallic material comprises forming a concave deflection with respect to a first surface of the base plate (80).

9. The method of claim 8, wherein a depth of each local concave deflection is between 5 to 200 μm.

10. The method of claim 1, further comprising:
mounting the base plate on a heat sink.

11. The method of claim 1, wherein forming the at least one first area comprises forming the at least one local concave deflection at one side of the layer of metallic material and forming at least one local convex deflection at an opposite side of the layer of metallic material from the at least one local concave deflection.

* * * * *